United States Patent [19]
Hwang

[11] Patent Number: 6,034,539
[45] Date of Patent: Mar. 7, 2000

[54] BONDING-OPTION ARCHITECTURE FOR INTEGRATED CIRCUITRY

[75] Inventor: Jeng-Yan Hwang, Hsinchu, Taiwan

[73] Assignee: Davicom Semiconductor, Inc., Hsin-chu, Taiwan

[21] Appl. No.: 09/047,900

[22] Filed: Mar. 25, 1998

[30] Foreign Application Priority Data

Nov. 20, 1997 [TW] Taiwan ................................ 86117338

[51] Int. Cl.⁷ ...................... H03K 19/173; H03K 19/177
[52] U.S. Cl. ................................ 326/38; 326/38; 326/39; 326/41; 326/47; 326/101; 326/37
[58] Field of Search ................................. 326/37–39, 41, 326/47, 101

[56] References Cited

U.S. PATENT DOCUMENTS

| | | | |
|---|---|---|---|
| 5,353,250 | 10/1994 | McAdams | 365/189.03 |
| 5,412,333 | 5/1995 | Okunaga | 327/198 |
| 5,682,105 | 10/1997 | Fujima | 326/30 |
| 5,880,596 | 3/1999 | White | 326/38 |
| 5,920,227 | 7/1999 | An | 327/544 |

*Primary Examiner*—Michael Tokar
*Assistant Examiner*—James A. Cho
*Attorney, Agent, or Firm*—Christie, Parker & Hale, LLP

[57] ABSTRACT

A bonding-option architecture is provided for use on an IC package for bonding option selections. The bonding-option architecture includes an option pad and a plurality of bonding entries connected to the option pad, each of the bonding entries being arranged in immediate proximity to one of the bonding points. In this bonding-option architecture, at least a first one of the bonding points is connected via a first one of the pins to an external power point and at least a second one of the bonding points is connected via a second one of the pins to an external ground point when the IC package is mounted on a circuit board. In the case when a high-voltage state logic signal is to be set via the option pad into the internal circuit of the IC chip, the first one of the bonding points is wired to the proximate one of the bonding entries; and in the case when a low-voltage state logic signal is into be set via the option pad to the internal circuit of the IC chip, the second one of the bonding points is wired to the proximate one of the bonding entries.

13 Claims, 6 Drawing Sheets

| MCMi | TEST | DCLKOE | SEL |
|---|---|---|---|
| 1 | 1 | 1 | 1 |
| 1 | 0 | 0 | 0 |
| 0 | 1 | 0 | 0 |
| 0 | 0 | 0 | 0 |

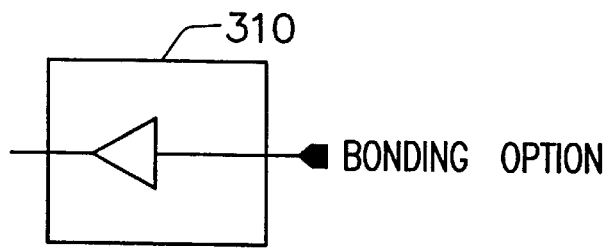
FIG. 5 (PRIOR ART)
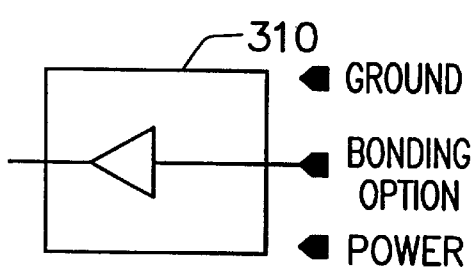 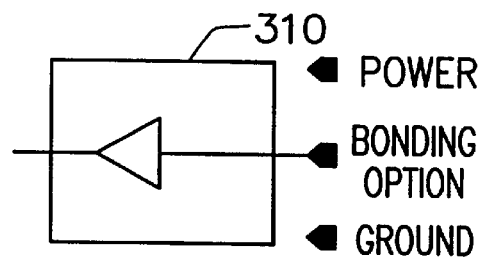
FIG. 6A (PRIOR ART)    FIG. 6B (PRIOR ART)
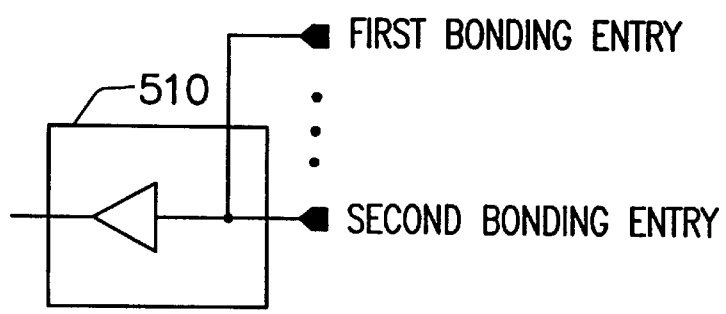
FIG. 7

BONDING-OPTION ARCHITECTURE FOR INTEGRATED CIRCUITRY

CROSS-REFERENCE TO RELATED APPLICATION

This application claims the priority benefit of Taiwan application serial no. 86117338, filed Nov. 20, 1997, the full disclosure of which is incorporated herein by reference.

BACKGROUND OF THE INVENTION

1. Field of the Invention

This invention relates to bonding-option architectures for integrated circuits (IC), and more particularly, to a bonding-option architecture for use in an IC package which allows selective setting of various logic states to the internal circuit of the IC chip in the IC package.

2. Description of Related Art

In the design of an integrated circuit (IC), a bonding-option architecture is usually provided to the IC so as to allow the user to selectively alter an aspect of the hardware configuration in the IC, which can facilitate the testing and debugging of the IC products. The bonding-option architecture includes a plurality of option pads which can be selectively bonded (called pad bonding) to either a high-voltage point (such as the system power) or a low-voltage point (such as the ground), so as to set various permanent logic states to the internal circuit. The provision of bonding-option architecture in ICs has the benefits of increasing the testability, lowering the costs, expanding the functionality, and adding extra values for the IC products.

Conventional bonding-option architectures include two types: a value-default type and a power/ground proximity type. In the value-default bonding-option architecture, each option pad is factory-preset to a certain logic state, 0 or 1, which can thereafter be altered by wiring the option pad to a proximate power point or ground point. If no wiring is made, the option pad will retain its preset logic state. One drawback to the value-default bonding-option architecture, however, is that, additional power will be consumed after making alternations to the preset logic states on the option pads. This drawback is particularly unacceptable in small-scale computers or compact electronic devices, such as notebook computers or palmtop game machines, where batteries are used as the main power source. In these devices, low-power consumption is a primary concern due to the short period of power utilization from the batteries. Therefore, when the value-default bonding-option architecture is used in ICs that are used in these power-precious machines, it can make these machines less competitive on the market.

On the other hand, the conventional power/ground proximity bonding-option architecture includes a plurality of option pads, each option pad being proximately arranged with a power point and a ground point respectively on the both sides thereof. No default logic states are preset to these option pads. A particular option pad can be set to a logic state of 1 by wiring it to the proximate power point, and to a logic state of 0 by wiring it to the proximate ground point. This type of bonding-option architecture is free from the power-consumptive problem in the value-default bonding-option architecture. However, its proximately arranged power and ground points can cause problems to the overall circuit layout for the IC package, and even an increased noise to the internal circuitry of the IC chip.

In IC designs, it is usually desirable to integrate as many functions as possible in a single IC chip instead of providing these functions in two separate IC chips. However, due to some incompatibility problems in electrical characteristics, it can be sometimes difficult to integrate certain various functions in a single IC chip. When this is the case, it is then desirable to pack the two IC chips in a single MCM (multiple-chip module) IC package so that the two chips can be tested, shipped, and utilized in a convenient and cost-effective manner. In such an MCM IC package, the signals that are transferred from one IC chip to the other can not be observed directly from the IC package. These signals can only be observed from the signal-receiving IC chip. Moreover, the signal-receiving IC chip can not receive externally input signals directly through the package but instead through the other IC chip. This structural and functional complexity makes the testing difficult to carry out, and the test vector can be unsuitable for use on the MCM IC package. The original test vector may have to be rewritten. Therefore, in order to facilitate the testing, one solution is to design the signal-receiving IC chip in an MCM IC package as that shown in FIG. 1A, which, in particular, incorporates a conventional bonding-option architecture.

As shown in FIG. 1A, the IC chip comprises an MCM (multiple-chip module) option pad which includes a value-default bonding-option device 10 and a bonding point 5; an input pad for a first clock signal TXDCLK1, which includes a logic circuit 50 and a bonding point 40; an I/O pad for a second clock signal TXDCLK2, which includes a logic circuit 30 and a bonding point 20; an AND gate 60; and a multiplexer 70. The output of the value-default bonding-option device 10 is denoted by MCMi. The AND gate 60 takes a test signal TEST and the MCMi signal as inputs to thereby produce an output signal DCLKOE whose value is the result of the AND-operation on TEST and MCMi. The output signal DCLKOE from the AND gate 60 serves as the selection signal SEL to the multiplexer 70 in such a manner that when SEL=0, the input at the 0 input end is selected as the multiplexer output, and when SEL=1, the input at the 1 input end is selected. FIG. 1B is a truth table showing the logic relationships among MCMi, TEST, DCLKOE, and SEL. The default logic state to the value-default bonding-option device 10 is 1 (no external wiring is made to the bonding point 5).

FIG. 2A shows one example in which the bonding points 5, 20, 40 in the IC chip of FIG. 1A are externally wired when in use. In the case of FIG. 2A, the bonding point 5 of the value-default bonding-option device 10 is wired to a ground leadframe 80, thereby altering the value of MCMi to 0. The bonding point 20 of the TXDCLK2 I/O pad is non-wired.

FIG. 2B shows the IC chip of FIG. 1A (here denoted by DIE2) being connected to another IC chip (denoted by DIE1). In the case of FIG. 2B, for example, the bonding points 5, 20, 40 in the IC chip DIE2 are such wired that the bonding point 5 of the value-default bonding-option device 10 (MCM option pad) is non-wired; the bonding point 40 of the TXDCLK1 signal input pad is wired to the bonding point 90 of the TXDCLK pad in the signal-sending IC chip DIE1; and the bonding point 20 of the TXDCLK2 signal I/O pad is wired to a corresponding leadframe 98 of the MCM option pad.

It can be learned from the truth table of FIG. 1B that, when TEST=0 (which indicates a normal mode of operation for the signal-receiving IC chip DIE 2), then SEL=0, which causes the multiplexer 70 to select the input signal at its 0 input end as its output (i.e., the output signal TXDCLK from the signal-sending IC chip DIE1, which is transmitted from the logic circuit 95 and the bonding point 90 in the signal-sending IC chip DIE1, subsequently via the bonding point 40 and the logic circuit 50 in the signal-receiving IC chip DIE 2, to the 0 input end of the multiplexer 70). The output of the multiplexer 70 is denoted by TXDCLK1. On the other hand, when TEST=1 (which indicates a test mode of operation for the signal-receiving IC chip DIE 2), then SEL=1, which causes the multiplexer 70 to select the input signal at its 1 input end as its output (i.e., the signal received from an external source via the bonding point 20 of the TXDCLK2 signal I/O pad). In this manner, the TXDCLK1 signal in the signal-receiving IC chip DIE 2 can be obtained directly via the TXDCLK2 I/O pad, instead of via the TXDCLK pad in the signal-sending IC chip DIE1 and the TXDCLK1 input pad in itself. Therefore, with the provision of the value-default bonding-option device 10, the signal-receiving IC chip DIE 2 can be integrated with various functions to meet various application requirements.

Conventionally, a single IC chip is only provided with some fixed functions. However, with the computer systems getting more complex, it is a common practice to provide a single IC chip with various selectable functions that can be set into active operation through a bonding-option means. The provision of a bonding-option architecture in an IC chip for selective activating of various functions in the IC chip is therefore a widely adopted IC design. Further details of the conventional bonding-option architectures with be described in the following.

FIG. 3A is a schematic diagram used to depict the use of a conventional value-default bonding-option device, as designated here by the reference numeral 120. As shown, the value-default bonding-option device 120 includes a passive circuit 110 which is factory-preset to be wired to a POWER point. The passive circuit 110 has a very low resistance that makes it highly conductive. When in conductive state, the passive circuit 110 has virtually no potential drop thereacross. Therefore, the connection of the passive circuit 110 to the preset POWER point allows the setting of a logic state of 1 to the IC internal circuit (not shown) connected to the value-default bonding-option device 120.

FIG. 3B is a schematic diagram used to depict another use of a conventional value-default bonding-option device, as designated here by the reference numeral 140. As shown, the value-default bonding-option device 140 here includes a passive circuit 130 which is factory-preset to be wired to a GROUND point. The passive circuit 130 has a very low resistance that makes it highly conductive. When in conductive state, the passive circuit 130 has virtually no potential drop thereacross. Therefore, the connection of the passive circuit 130 to the preset GROUND point allows the setting of a logic state of 0 to the IC internal circuit (not shown) connected to the value-default bonding-option device 140.

FIG. 4A is a schematic diagram used to depict the utilization of a conventional value-default bonding-option device, as designated here by the reference numeral 220. As shown, the value-default bonding-option device 220 here includes a passive circuit 210 which is factory-preset to be wired to a POWER point. The passive circuit 210 has a very low resistance that makes it highly conductive. When in conductive state, the passive circuit 210 has virtually no potential drop thereacross. Therefore, the connection of the passive circuit 210 to the preset POWER point allows the setting of a logic state of 1 into the IC internal circuit (not shown) connected to the value-default bonding-option device 220. In addition, a GROUND point is arranged in immediate proximity to the POWER point. When a logic setting of 1 is required, no alternation is made to this value-default bonding-option device 220. On the other hand, if the default setting is to be altered from 1 to 0, the technician needs just to wire the POWER point and the proximate GROUND point together to a common ground leadframe.

FIG. 4B is a schematic diagram showing a variation to the value-default bonding-option device 220 of FIG. 4A. As shown, the value-default bonding-option device 220 here differs from the one shown in FIG. 4A only in that the GROUND point is arranged on the other side of the POWER point, but is still in immediate proximity to the POWER point.

FIG. 4C is a schematic diagram used to depict the utilization of a conventional value-default bonding-option device, as designated here by the reference numeral 240. As shown, the value-default bonding-option device 240 here includes a passive circuit 230 which is factory-preset to be wired to a GROUND point. The passive circuit 230 has a very low resistance that makes it highly conductive. When in conductive state, the passive circuit 230 has virtually no potential drop thereacross. Therefore, the connection of the passive circuit 230 to the preset GROUND point allows the setting of a logic state of 0 to the IC internal circuit (not shown) connected to the value-default bonding-option device 240. In addition, a POWER point is arranged in immediate proximity to the GROUND point. When a logic setting of 0 is required, no alternation is made to this value-default bonding-option device 240. On the other hand, if the default setting is to be altered from 0 to 1, the technician needs just to wire the POWER point and the proximate GROUND point together to a common power leadframe.

FIG. 4D is a schematic diagram showing a variation to the value-default bonding-option device 240 of FIG. 4C. As shown, the value-default bonding-option device 240 here differs from the one shown in FIG. 4C only in that the POWER point is arranged instead on the other side of the GROUND point, but is still in immediate proximity to the GROUND point.

One drawback to the foregoing bonding-option architecture is that additional power will be consumed if the default settings are altered in use. This drawback is particularly unacceptable when the value-default bonding-option architecture is used in IC chips that are used in small-scale computers or compact electronic devices, such as notebook computers, where batteries are used as the main power source. The conventional value-default bonding-option architecture, therefore, can make these products less competitive on the market.

FIG. 5 is a schematic diagram showing a conventional power/ground proximity bonding-option architecture. As shown, the power/ground proximity bonding-option architecture includes an option pad 310 which is wired to a BONDING OPTION point. The option pad 310 is similar in structure and function to a typical input pad. In this bonding-option architecture, no default logic states are preset to the option pad 310. The setting of logic states to this bonding-option architecture will be depicted in the following with reference to FIGS. 6A–6B.

As shown in FIG. 6A, the power/ground proximity bonding-option architecture can be arranged in such a manner that a POWER point and a GROUND point are arranged in proximity on both sides of the BONDING OPTION point connected to the option pad 310. When a high-voltage logic state is to be set to the option pad 310, the BONDING OPTION point and the proximate POWER point are wired via respective bonding wires to a common power leadframe (not shown); and whereas when a low-voltage logic state is to be set to the option pad 310, the BONDING OPTION point and the proximate GROUND point are wired via respective bonding wires to a common ground leadframe (not shown).

FIG. 6B is a schematic diagram showing a variation to the value-default bonding-option device of FIG. 6A. As shown, the value-default bonding-option device here differs from the one shown in FIG. 6A only in that the POWER point and the GROUND point are here interchanged in position, but are still arranged in proximity on both sides of the BONDING OPTION point wired to the option pad 310.

The foregoing power/ground proximity bonding-option architecture is more advantageous than the value-default bonding-option architecture in that it will not cause additional power consumption. However, the arrangement of the POWER point and the GROUND point in proximity on both sides of the BONDING OPTION point may not be always achievable in certain designs, in that such an arrangement can cause reliability problems to the IC products, and can affect the overall layout and operation of the IC package. The conventional power/ground proximity bonding-option architecture is therefore still unsatisfactory in use.

SUMMARY OF THE INVENTION

It is therefore an objective of the present invention to provide a new bonding-option architecture for integrated circuitry, which is less power-consumptive and more convenient and reliable to implement than the prior art.

It is another objective of the present invention to provide a new bonding-option architecture for integrated circuitry, which can eliminate the problem of noise that would otherwise occur due to the arrangement of power points in close proximity to ground points.

It is still another objective of the present invention to provide a new bonding-option architecture for integrated circuitry, which can help increase the life of use of the batteries used in portable computers or electronic devices.

In accordance with the foregoing and other objectives of the present invention, a new bonding-option architecture for integrated circuitry is provided.

The bonding-option architecture is provided for use on an IC package having a plurality of pins and containing an IC chip having an internal circuit and a plurality of bonding points, each of the bonding points being selectively wired to a selected one of the pins. The bonding-option architecture includes an option pad; and a plurality of bonding entries connected to the option pad, each of the bonding entries being arranged in immediate proximity to one of the bonding points. In this IC package, at least a first one of the bonding points is connected via a first one of the pins to an external power point and at least a second one of the bonding points is connected via a second one of the pins to an external ground point when the IC package is mounted for use. Further, at least a first one of the bonding points is connected via a first one of the leadframes and a first one of the pins to a first external potential point, and at least a second one of the bonding points is connected via a second one of the leadframes and a second one of the pins to a second external potential point when the IC package is in use. In the case when a first logic state is to be set via the option pad to the internal circuit of the IC chip, the first one of the bonding points is wired to the proximate one of the bonding entries; and in the case when a second logic state is to be set via the option pad to the internal circuit of the IC chip, the second one of the bonding points is wired to the proximate one of the bonding entries.

The foregoing bonding-option architecture of the invention is less power-consumptive than the conventional value-default bonding-option architecture and is more convenient and reliable to implement than the conventional power/ground proximity bonding-option architecture. The invention would therefore be more competitive on the IC market.

BRIEF DESCRIPTION OF DRAWINGS

The invention can be more fully understood by reading the following detailed description of the preferred embodiments, with reference made to the accompanying drawings, wherein:

FIG. 5 is a schematic diagram showing a conventional power/ground proximity bonding-option architecture;

FIG. 6A is a schematic diagram used to depict the utilization of the power/ground proximity bonding-option architecture of FIG. 5;

FIG. 6B shows a variation to the utilization of the power/ground proximity bonding-option architecture of FIG. 5

FIG. 7 is a schematic diagram of the bonding-option architecture according to the invention;

DETAILED DESCRIPTION OF PREFERRED EMBODIMENTS

FIG. 7 is a schematic diagram of the bonding-option architecture according to the invention. As shown, this bonding-option architecture comprises an option pad 510 and a plurality of bonding points including a FIRST BONDING ENTRY point and a SECOND BONDING ENTRY point. In between the FIRST BONDING ENTRY point and the SECOND BONDING ENTRY point are there provided with a number of bonding points (shown as dots) which are used for various other data/signal input/output ports.

Figures 1A, 1B:
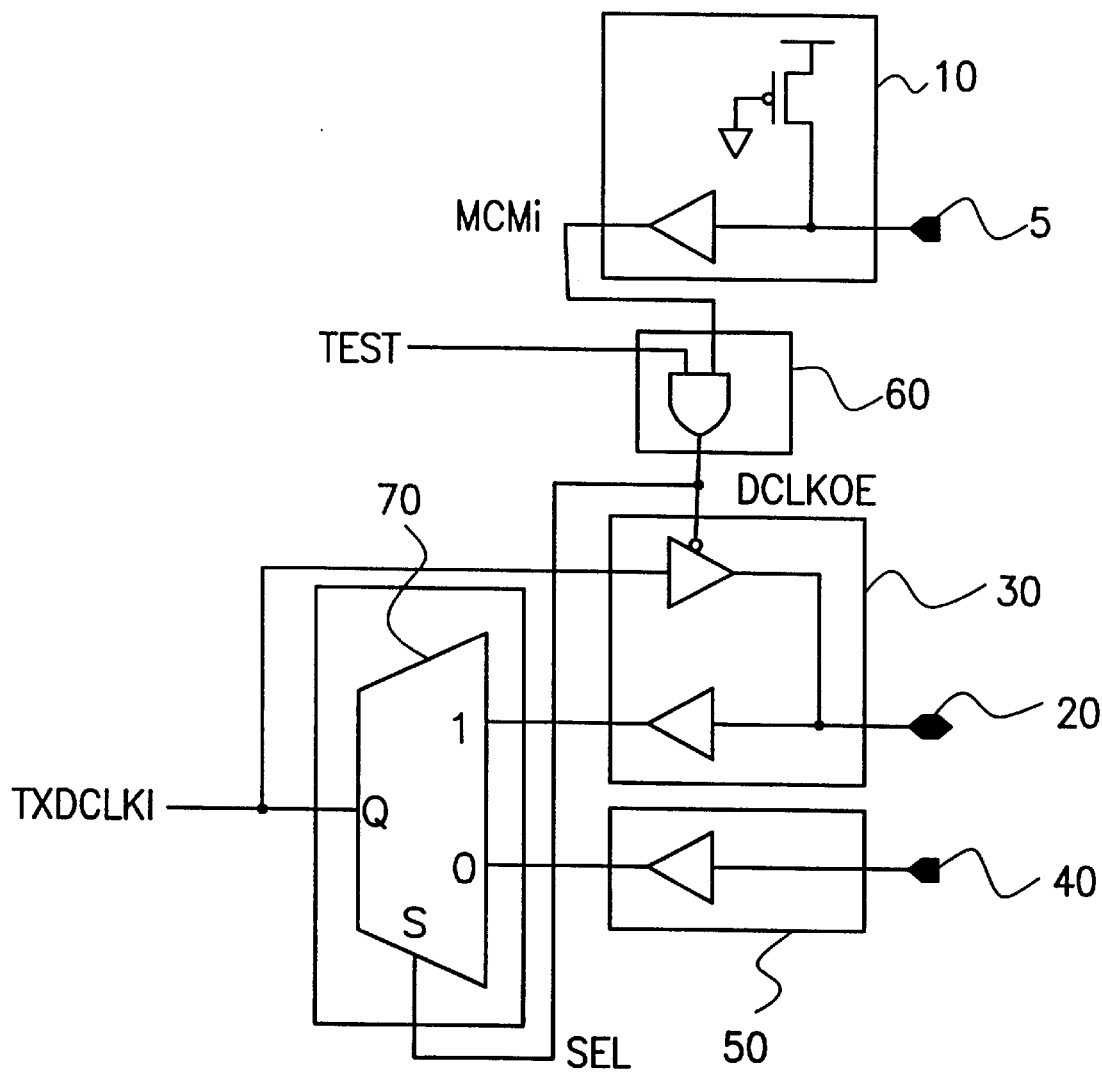
FIG. 1A is a schematic diagram of the internal circuit of an IC chip on which a conventional bonding-option architecture is provided.
FIG. 1B is a truth table showing the logic relationships among four logic signals in the circuit of FIG. 1A.
Figure 2A:
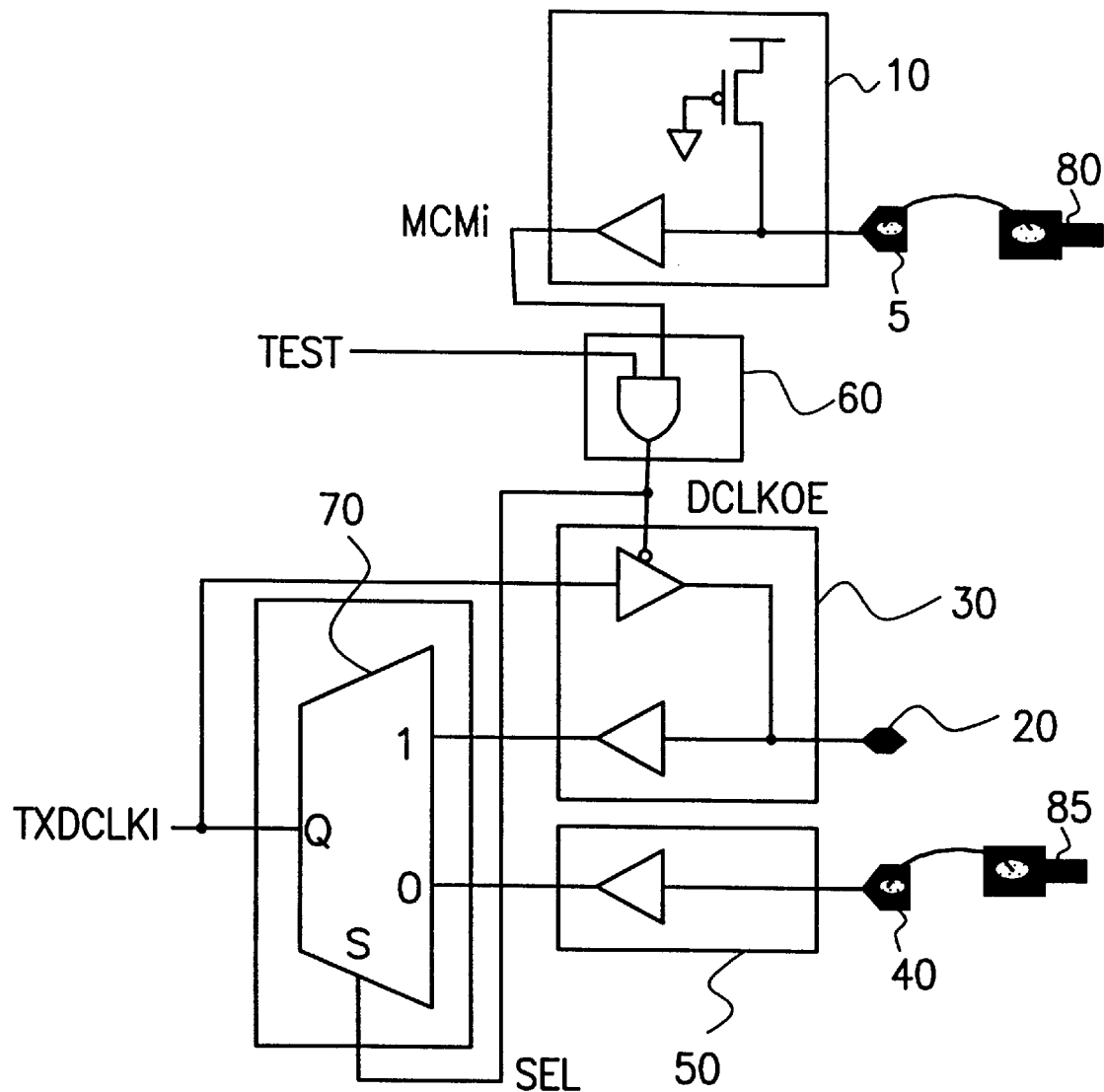
FIG. 2A shows one example in which the bonding points in the IC chip of FIG. 1A are externally wired when in use.
Figure 2B:
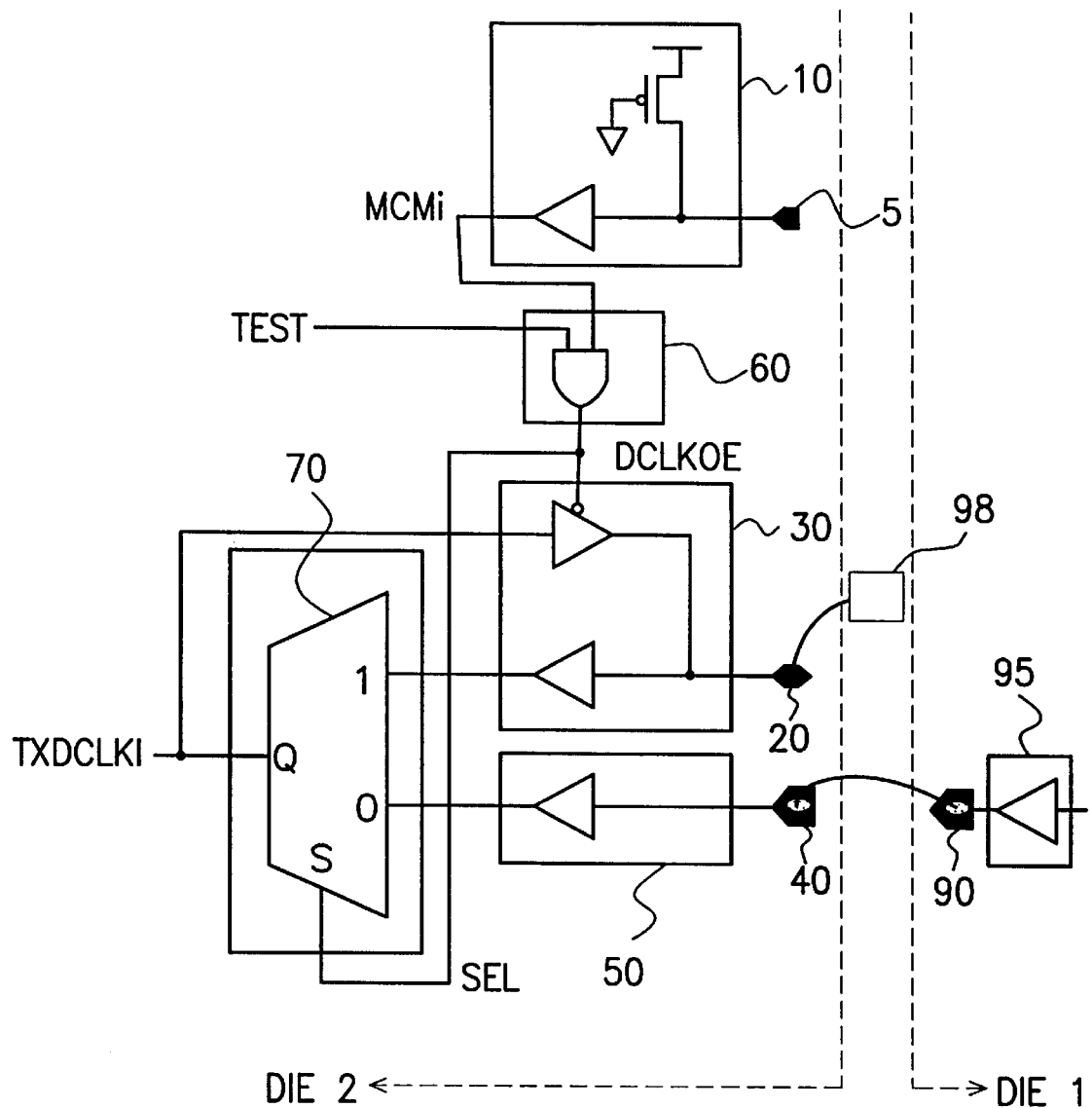
FIG. 2B is schematic diagram showing the IC chip of FIG. 1A being connected to another IC chip to form an MCM IC package.
Figure 3A:
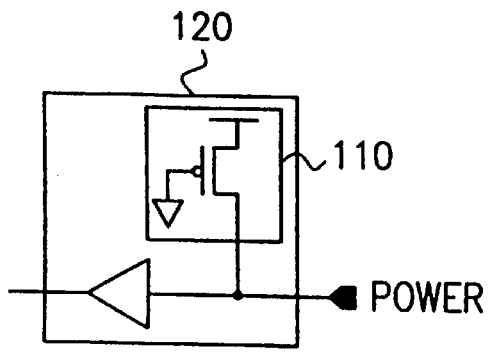
FIG. 3A is a schematic diagram used to depict a conventional value-default bonding-option device when connected to a power point.
Figure 3B:
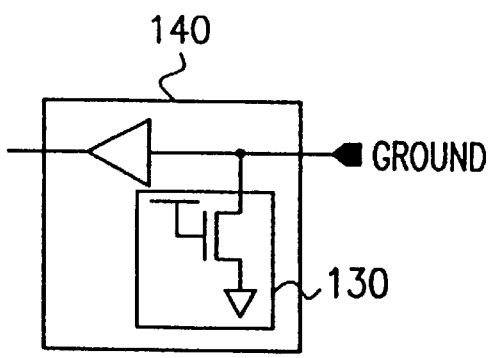
FIG. 3B is a schematic diagram used to depict a conventional value-default bonding-option device when connected to a ground point.
Figure 4A:
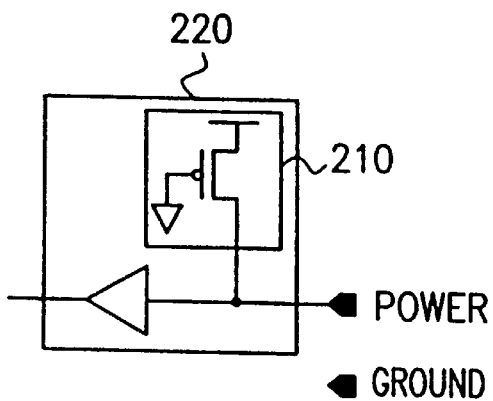
FIG. 4A is a schematic diagram used to depict the utilization of the value-default bonding-option device of FIG. 3A.
Figure 4B:
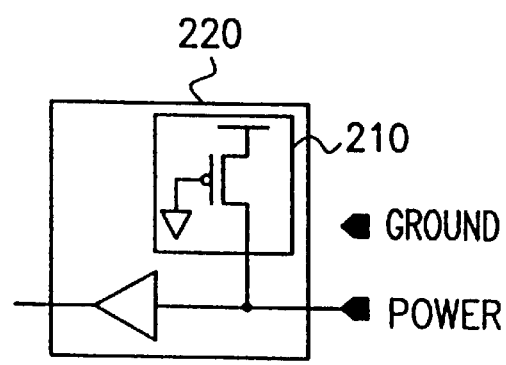
FIG. 4B shows a variation to the value-default bonding-option architecture of FIG. 4A.
Figure 4C:
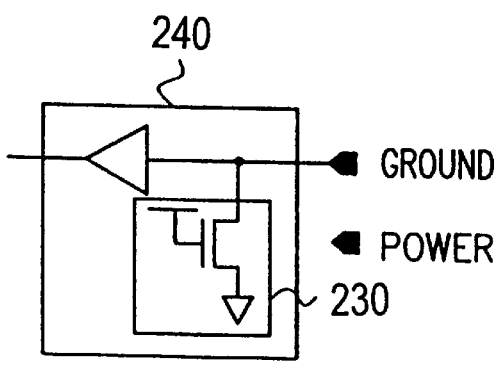
FIG. 4C is a schematic diagram used to depict the utilization of the value-default bonding-option device of FIG. 313.
Figure 4D:
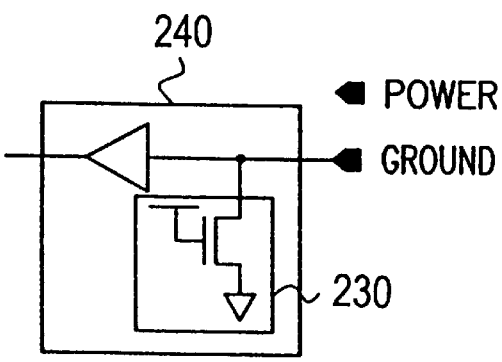
FIG. 4D shows a variation to the value-default bonding-option architecture of FIG. 4C.
Figure 8A:
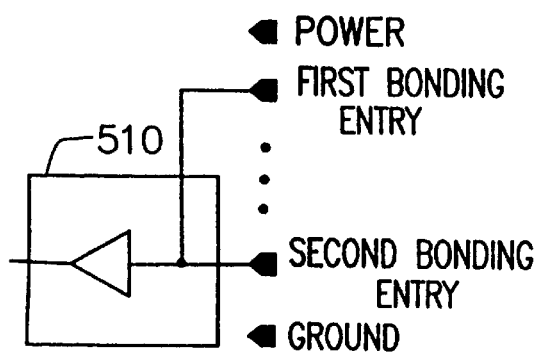
FIG. 8A is a schematic diagram used to depict a first preferred embodiment of the bonding-option architecture of FIG. 7.

FIG. 8A is a schematic diagram showing a first preferred embodiment of the bonding-option architecture according to the invention. In this embodiment, the FIRST BONDING ENTRY point is arranged in immediate proximity to a POWER point, allowing these two points to be connected via respective wires to a power leadframe (not shown) when a first logic state, for example 1, is to be set to the option pad 510; while the SECOND BONDING ENTRY point is arranged in immediate proximity to a GROUND point, allowing these two points to be connected via respective wires to a ground leadframe (not shown) when a second logic state, for example 0, is to be set to the option pad 510. In between the FIRST BONDING ENTRY point and the SECOND BONDING ENTRY point are there provided with a number of bonding points (shown as dots). In actual use, the option is selected between the wiring of the FIRST BONDING ENTRY point and the proximate POWER point via respective bonding wires to the power leadframe (not shown) and the wiring of the SECOND BONDING ENTRY point and the proximate GROUND point via respective bonding wires to the ground leadframe (not shown). Only one of these two options can be selected in one application according to actual requirements.

Figure 8B:
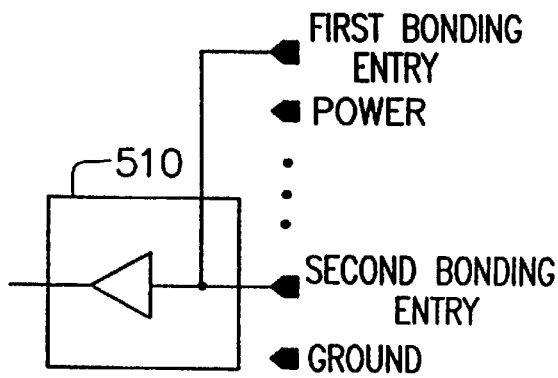
FIG. 8B is a schematic diagram used to depict a second preferred embodiment of the bonding-option architecture of FIG. 7.

FIG. 8B shows a variation to the bonding-option architecture of the invention. This embodiment shown in FIG. 8B differs from the one shown in FIG. 8A only in that the POWER point is here arranged on the bottom side (instead of upper side as in FIG. 8A) of the FIRST BONDING ENTRY point, but is still in immediate proximity to the FIRST BONDING ENTRY point.

Figure 8C:
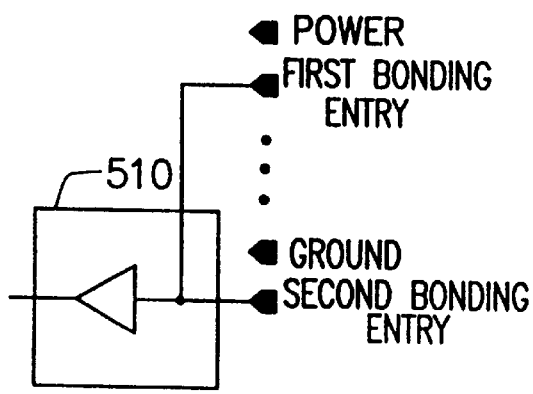
FIG. 8C is a schematic diagram used to depict a third preferred embodiment of the bonding-option architecture of FIG. 7.

FIG. 8C shows still another variation to the bonding-option architecture of the invention. This embodiment shown in FIG. 8C differs from the previous one shown in FIG. 8A only in that the GROUND point is here arranged on the upper side (instead of bottom side as in FIG. 8A) of the SECOND BONDING ENTRY point, but is still in immediate proximity to the SECOND BONDING ENTRY point.

Figure 8D:
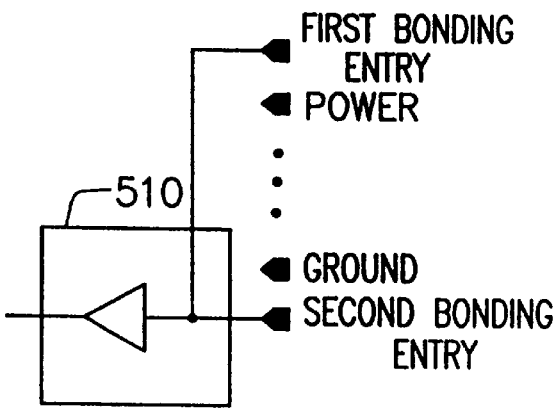
FIG. 8D is a schematic diagram used to depict a fourth preferred embodiment of the bonding-option architecture of FIG. 7.

FIG. 8D shows yet still another variation to the bonding-option architecture of the invention. This embodiment shown in FIG. 8D differs from the previous one shown in FIG. 8A only in that the POWER point is here arranged on the bottom side (instead of upper side as in FIG. 8A) of the FIRST BONDING ENTRY point, but is still in immediate proximity to the FIRST BONDING ENTRY point; while the GROUND point is arranged on the upper side (instead of bottom side as in FIG. 8A) of the SECOND BONDING ENTRY point, but is still in immediate proximity to the SECOND BONDING ENTRY point.

Figure 9:
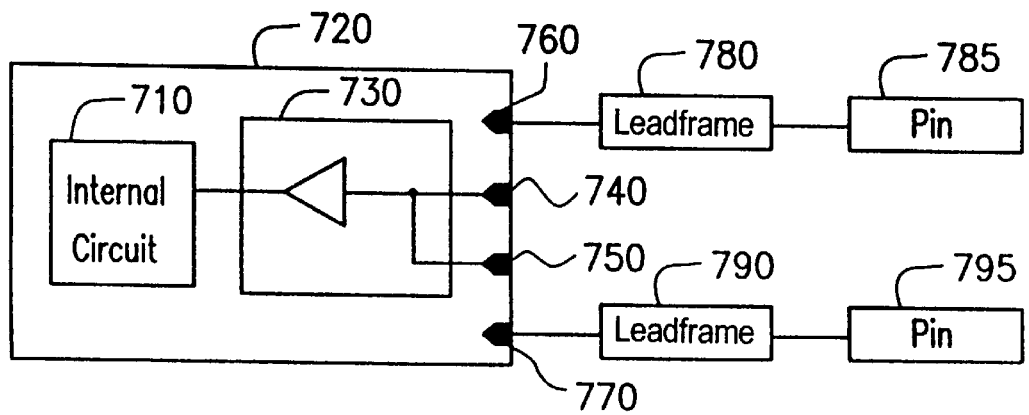
FIG. 9 is a schematic diagram used to depict the utilization of the bonding-option architecture of the invention in an IC package.

FIG. 9 is a schematic diagram used to depict the utilization of the bonding-option architecture of the invention on an IC package. The bonding-option architecture of the invention is here incorporated in an IC chip 720, which includes an option pad 730 formed with a plurality of bonding entries, for example a first bonding entry 740 and a second bonding entry 750. Further, the IC chip 720 includes an internal circuit 710 and a plurality of bonding points, for example a first bonding point 760 and a second bonding point 770. The first bonding point 760 is wired to a first leadframe 780 connected to a first pin 785 of the IC package, and the second bonding point 770 is wired to a second leadframe 790 connected to a second pin 795. The option pad 730 can serve as a connecting port for the internal circuit 710 of the IC chip 720, which can be set to perform either a simplex data input function, a simplex data output function, or a duplex data input/output function. If the IC chip 720 needs a simplex data input function, the option pad 730 is set to serve as a simplex input port; if the IC chip 720 needs a simplex data output function, the option pad 730 is set to serve as a simplex output port; and if the IC chip 720 needs a duplex data input/output function, the option pad 730 is set to serve as a duplex input/output port.

In this preferred embodiment, for example, the first pin 785 can be connected to a power point and the second pin 795 can be connected to a ground point when the IC package is mounted for use on a circuit board. This allows the first bonding point 760, which is arranged in immediate proximity to the first bonding entry 740, to be set as a power point, and the second bonding point 770, which is arranged in immediate proximity to the second bonding entry 750, to be set as a ground point. Therefore, in the case when a logic state of 1 is to be set via the option pad 730 into the internal circuit 710, the technician can simply wire the first bonding entry 740 to the first bonding point 760; on the other hand, when a logic state of 0 is to be set, the technician can simply wire the second bonding entry 750 to the second bonding point 770.

In conclusion, the bonding-option architecture of the invention is less power-consumptive than the conventional value-default bonding-option architecture and is more convenient and reliable to implement than the conventional power/ground proximity bonding-option architecture. The invention would therefore be considerably more competitive on the IC market.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A bonding-option architecture for use on an IC package having a plurality of pins and containing an IC chip having an internal circuit and a plurality of bonding points, each of said bonding points being selectively wired to a selected one of said pins, said bonding-option architecture comprising:

an option pad; and a plurality of bonding entries connected to said option pad, each of said bonding entries being arranged in immediate proximity to one of said bonding points;

wherein at least a first one of said bonding points is connected via a first one of said pins to an external power point and at least a second one of said bonding points is connected via a second one of said pins to an external ground point when said IC package is mounted for use; and wherein in the case when a high-voltage state logic signal is to be set via said option pad into the internal circuit of said IC chip, said first one of said bonding points is wired to the proximate one of said bonding entries; and in the case when a low-voltage state logic signal is to be set via said option pad into the internal circuit of said IC chip, said second one of said bonding points is wired to the proximate one of said bonding entries.

2. The bonding-option architecture of claim 1, wherein said option pad serves as a connecting port for said IC chip which can be selectively set to perform either a simplex data input function, a simplex data output function, or a duplex data input/output function.

3. The bonding-option architecture of claim 2, wherein said option pad is set to serve as a simplex input port for said IC chip to perform said simplex data input function.

4. The bonding-option architecture of claim 2, wherein said option pad is set to serve as a simplex output port for said IC chip to perform said simplex data output function.

5. The bonding-option architecture of claim 2, wherein said option pad is set to serve as a duplex input/output port for said IC chip to perform said duplex data input/output function.

6. The bonding-option architecture of claim 1, wherein among said bonding entries, only one is selected for wiring to its proximate one of said bonding points.

7. An IC package with bonding-option architecture, which comprises:

an IC chip having an internal circuit and a plurality of bonding points;

a plurality of leadframes selectively connected to said bonding points on said IC chip;

a plurality of pins selectively connected to said leadframes;

an option pad formed on said IC chip; and a plurality of bonding entries formed on said IC chip and connected to said option pad, each of said bonding entries being arranged in immediate proximity to one of said bonding points;

wherein at least a first one of said bonding points is connected via a first one of said leadframes and a first one of said pins to a first external potential point, and at least a second one of said bonding points is connected via a second one of said leadframes and a second one of said pins to a second external potential point when said IC package is in use; and wherein in the case when a first logic state is to be set via said option pad to the internal circuit of said IC chip, said first one of said bonding points is wired to a proximate one of said bonding entries; and in the case when a second logic state is to be set via said option pad to the internal circuit of said IC chip, said second one of said bonding points is wired to a proximate one of said bonding entries.

8. The bonding-option architecture of claim 7, wherein said first external potential point to which said first one of said pins is connected to is a power point, while said second external potential point to which said second one of said pins is connected to is a ground point.

9. The bonding-option architecture of claim 7, wherein said option pad serves as a connecting port for said IC chip which can be set to perform either a simplex data input function, a simplex data output function, or a duplex data input/output function.

10. The bonding-option architecture of claim 9, wherein said option pad is set to serve as a simplex input port for said IC chip to perform said simplex data input function.

11. The bonding-option architecture of claim 9, wherein said option pad is set to serve as a simplex output port for said IC chip to perform said simplex data output function.

12. The bonding-option architecture of claim 9, wherein said option pad is set to serve as a duplex input/output port for said IC chip to perform said duplex data input/output function.

13. The bonding-option architecture of claim 7, wherein among said bonding entries, only one is selected for wiring to its proximate one of said bonding points.

* * * * *